United States Patent
Sugiura et al.

(10) Patent No.: US 10,796,812 B2
(45) Date of Patent: Oct. 6, 2020

(54) COATING LIQUID FOR FORMING CONDUCTIVE LAYER, METHOD FOR PRODUCING CONDUCTIVE LAYER, AND CONDUCTIVE LAYER

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Motohiko Sugiura, Osaka (JP); Issei Okada, Osaka (JP); Yoshio Oka, Osaka (JP); Atsushi Kimura, Koka (JP); Kenji Ohki, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 93 days.

(21) Appl. No.: 16/084,350

(22) PCT Filed: Mar. 14, 2017

(86) PCT No.: PCT/JP2017/010283
§ 371 (c)(1),
(2) Date: Sep. 12, 2018

(87) PCT Pub. No.: WO2017/159704
PCT Pub. Date: Sep. 21, 2017

(65) Prior Publication Data
US 2019/0077974 A1  Mar. 14, 2019

(30) Foreign Application Priority Data

Mar. 15, 2016 (JP) .................. 2016-051703

(51) Int. Cl.
*H01B 1/22* (2006.01)
*B05D 5/12* (2006.01)
(Continued)

(52) U.S. Cl.
CPC .............. *H01B 1/22* (2013.01); *B05D 5/12* (2013.01); *C08L 79/02* (2013.01); *C09D 5/24* (2013.01);
(Continued)

(58) Field of Classification Search
CPC . H01B 1/026; H01B 1/16; H01B 1/22; H01B 5/14; C09D 5/24; C09D 7/40;
(Continued)

(56) References Cited

U.S. PATENT DOCUMENTS

| | | | |
|---|---|---|---|
| 7,445,731 B2 * | 11/2008 | Okada | C09D 11/322 252/500 |
| 2012/0168684 A1 * | 7/2012 | Magdassi | B82Y 30/00 252/500 |
| 2014/0065425 A1 * | 3/2014 | Bogdanov | A61K 47/6929 428/407 |

FOREIGN PATENT DOCUMENTS

| | | | |
|---|---|---|---|
| JP | 2005089784 A | * | 4/2005 |
| JP | 2008-34358 A | | 2/2008 |
| JP | 2011046770 A | * | 3/2011 |

OTHER PUBLICATIONS

English machine translation of Matsuki et al. (JP 2011-046770 A) (Year: 2011).*
(Continued)

*Primary Examiner* — Matthew R Diaz
(74) *Attorney, Agent, or Firm* — Faegre Drinker Biddle & Reath LLP

(57) ABSTRACT

A coating liquid for forming a conductive layer according to the present invention is a coating liquid for forming a conductive layer, the coating liquid containing fine metal
(Continued)

particles, a dispersant, and a dispersion medium. In the coating liquid for forming a conductive layer, the fine metal particles contain copper or a copper alloy as a main component, the dispersant is a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, and the graft copolymer has a weight-average molecular weight of 3,000 or more and 54,000 or less.

7 Claims, 1 Drawing Sheet

(51) Int. Cl.
| | | |
|---|---|---|
| C09D 7/40 | (2018.01) | |
| C09D 7/65 | (2018.01) | |
| C09D 11/52 | (2014.01) | |
| H05K 1/09 | (2006.01) | |
| H01B 1/02 | (2006.01) | |
| C09D 5/24 | (2006.01) | |
| C08L 79/02 | (2006.01) | |

(52) U.S. Cl.
CPC .............. *C09D 7/40* (2018.01); *C09D 7/65* (2018.01); *C09D 7/68* (2018.01); *C09D 11/52* (2013.01); *H01B 1/026* (2013.01); *H05K 1/097* (2013.01); *H05K 2203/1131* (2013.01)

(58) Field of Classification Search
CPC ... C09D 7/65; C09D 7/67; C09D 7/68; C09D 11/52; C09D 179/02; C09D 179/08; C08L 79/02; C08L 79/08; H05K 1/092; H05K 1/095; H05K 1/097; H05K 2201/0266; H05K 2203/1131; B05D 5/12
See application file for complete search history.

(56) References Cited

OTHER PUBLICATIONS

English machine translation of Matshima et al. (JP 2005-089784 A) (Year: 2005).*
Office Action dated Apr. 11, 2019 that issued in U.S. Appl. No. 15/756,629.

* cited by examiner

COATING LIQUID FOR FORMING CONDUCTIVE LAYER, METHOD FOR PRODUCING CONDUCTIVE LAYER, AND CONDUCTIVE LAYER

TECHNICAL FIELD

The present invention relates to a coating liquid for forming a conductive layer, a method for producing a conductive layer, and a conductive layer.

The present application claims priority from Japanese Patent Application No. 2016-51703 filed on Mar. 15, 2016, and the entire contents of the Japanese patent application are incorporated herein by reference.

BACKGROUND ART

In recent years, with the realization of electronic devices having a smaller size and higher performance, there has been a need for a higher density of printed circuit boards.

To meet such a need, a printed circuit board has been proposed in which a sintered layer of fine metal particles is disposed on a base film having an insulating property (refer to Japanese Unexamined Patent Application Publication No. 2008-34358).

CITATION LIST

Patent Literature

PTL 1: Japanese Unexamined Patent Application Publication No. 2008-34358

SUMMARY OF INVENTION

A coating liquid for forming a conductive layer according to an embodiment of the present invention is a coating liquid for forming a conductive layer, the coating liquid containing fine metal particles, a dispersant, and a dispersion medium. In the coating liquid for forming a conductive layer, the fine metal particles contain copper or a copper alloy as a main component, the dispersant is a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, and the graft copolymer has a weight-average molecular weight of 3,000 or more and 54,000 or less.

A method for producing a conductive layer according to another embodiment of the present invention is a method for producing a conductive layer using a coating liquid for forming a conductive layer, the coating liquid containing fine metal particles, a dispersant, and a dispersion medium. The method includes an application step of applying the coating liquid for forming a conductive layer, and a heating step of, after the application, heating the coating liquid for forming a conductive layer. In the method, the fine metal particles contain copper or a copper alloy as a main component, the dispersant is a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, and the graft copolymer has a weight-average molecular weight of 3,000 or more and 54,000 or less.

A conductive layer according to another embodiment of the present invention is a conductive layer including a sintered body of fine metal particles. In the conductive layer, the fine metal particles contain copper or a copper alloy as a main component, the sintered body includes a residue derived from a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, and the graft copolymer has a weight-average molecular weight of 3,000 or more and 54,000 or less.

DESCRIPTION OF EMBODIMENTS

Technical Problem

Figure 1:
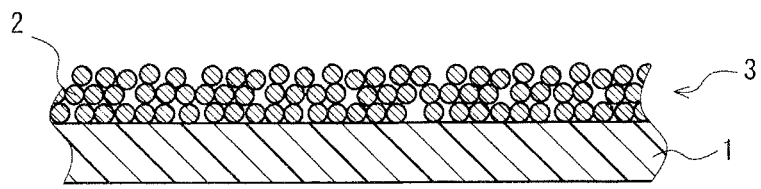
FIG. 1 is a schematic sectional view illustrating an application step of a method for producing a conductive layer according to an embodiment of the present invention.

According to the printed circuit board described in the above patent application publication, when a coating liquid containing fine metal particles is applied onto a base film and subsequently heated, a conductive layer (fine metal particle-sintered layer) can be caused to adhere directly to the base film. Therefore, this printed circuit board can realize a high density to a certain degree compared with a case where, for example, a conductive layer is formed on a base film with an adhesive therebetween. However, even when the coating liquid is applied onto a base film, the fine metal particles are unlikely to be uniformly dispersed on the base film because, in general, fine metal particles easily aggregate in a coating liquid. Therefore, the conductive layer obtained by heat-treating the coating liquid tends to have dense and sparse portions, and denseness and smoothness of the surface of the conductive layer tend to be insufficient.

The present invention has been made on the basis of the circumstances described above. An object of the present invention is to provide a coating liquid for forming a conductive layer, the coating liquid being capable of forming a conductive layer having good denseness and smoothness, and a method for producing the conductive layer. Another object of the present invention is to provide a conductive layer having good denseness and smoothness.

Advantageous Effects of Invention

The coating liquid for forming a conductive layer and the method for producing a conductive layer according to the present invention enable formation of a conductive layer having good denseness and smoothness. The conductive layer according to the present invention has good denseness and smoothness.

Description of Embodiments of the Present Invention

First, embodiments of the present invention will be listed and described.

A coating liquid for forming a conductive layer according to an embodiment of the present invention is a coating liquid for forming a conductive layer, the coating liquid containing fine metal particles, a dispersant, and a dispersion medium. In the coating liquid for forming a conductive layer, the fine metal particles contain copper or a copper alloy as a main component, the dispersant is a polyethyleneimine-polyethylene oxide graft copolymer (hereinafter, also referred to as a "PEI-PEO graft copolymer"), a polyethyleneimine (hereinafter, also referred to as "PEI") moiety in the graft copolymer has a weight-average molecular weight of 300 or more and 1,000 or less, a molar ratio of polyethylene oxide (hereinafter, also referred to as "PEO") chains to nitrogen atoms in the polyethyleneimine moiety is 10 or more and 50 or less, and the graft copolymer has a weight-average molecular weight of 3,000 or more and 54,000 or less.

The coating liquid for forming a conductive layer contains, as the dispersant, a PEI-PEO graft copolymer, and the weight-average molecular weight of the PEI moiety in the PEI-PEO graft copolymer, the molar ratio of PEO chains to nitrogen atoms in the PEI moiety, and the weight-average molecular weight of the PEI-PEO graft copolymer are within the above ranges. Thus, uniform dispersibility of the PEI-PEO graft copolymer in the dispersion medium can be enhanced. According to this configuration, nitrogen atoms in the PEI moiety of the PEI-PEO graft copolymer are coordinated on the fine metal particle side, and thus the fine metal particles can be easily uniformly dispersed in the dispersion medium. Therefore, the coating liquid for forming a conductive layer has good dispersibility of the fine metal particles and good storage stability. Accordingly, when the coating liquid for forming a conductive layer is applied to one of surfaces of a base film that forms a printed circuit board base material and subsequently heated, a conductive layer (fine metal particle-sintered layer) having good denseness and smoothness can be formed on the one surface of the base film.

The fine metal particles preferably have a mean particle size $D_{50}$ of 1 nm or more and 200 nm or less. According to the coating liquid for forming a conductive layer, even when the fine metal particles have a relatively small mean particle size $D_{50}$ within this range, the fine metal particles can be uniformly dispersed in the dispersion medium. Therefore, a conductive layer having good denseness and smoothness can be easily and reliably formed by adjusting the mean particle size $D_{50}$ of the fine metal particles to the above range.

The coating liquid for forming a conductive layer preferably has a pH of 4 or more and 8 or less. When the coating liquid for forming a conductive layer has a pH within this range, dispersibility of the fine metal particles can be further improved.

A content ratio of nitrogen atoms derived from the dispersant to the fine metal particles is preferably 0.01% by mass or more and 10% by mass or less. When the content ratio of nitrogen atoms derived from the dispersant to the fine metal particles is within this range, dispersibility of the fine metal particle is improved, and inhibition of sintering of fine metal particles due to the dispersant is suppressed during the formation of a conductive layer. Thus, a conductive layer that is dense and has a low resistance can be formed.

A method for producing a conductive layer according to another embodiment of the present invention is a method for producing a conductive layer using a coating liquid for forming a conductive layer, the coating liquid containing fine metal particles, a dispersant, and a dispersion medium. The method includes an application step of applying the coating liquid for forming a conductive layer, and a heating step of, after the application, heating the coating liquid for forming a conductive layer. In the method, the fine metal particles contain copper or a copper alloy as a main component, the dispersant is a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, and the graft copolymer has a weight-average molecular weight of 3,000 or more and 54,000 or less.

In the method for producing a conductive layer, a conductive layer is produced by using a coating liquid for forming a conductive layer, the coating liquid having good dispersibility of the fine metal particles in a dispersion medium and good storage stability due to the presence of a predetermined PEI-PEO graft copolymer contained as a dispersant. Therefore, the method for producing a conductive layer enables formation of a conductive layer (fine metal particle-sintered layer) having good denseness and smoothness.

A conductive layer according to another embodiment of the present invention is a conductive layer including a sintered body of fine metal particles. In the conductive layer, the fine metal particles contain copper or a copper alloy as a main component, the sintered body includes a residue derived from a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, and the graft copolymer has a weight-average molecular weight of 3,000 or more and 54,000 or less.

In the conductive layer, the sintered body of fine metal particles contains a predetermined PEI-PEO graft copolymer. That is, the conductive layer is formed by sintering fine metal particles that are uniformly dispersed in a coating liquid due to the presence of the PEI-PEO graft copolymer. Therefore, the conductive layer has good denseness and smoothness.

Herein, the term "main component" refers to a component having the highest content and refers to a component contained in an amount of, for example, 50% by mass or more and preferably 80% by mass or more. The term "weight-average molecular weight" refers to a value measured by using a gel permeation chromatography (GPC) system using N-methyl-2-pyrrolidone as a developing solvent and using monodisperse polystyrene standards. The term "mean particle size $D_{50}$ of fine metal particles" refers to a mean particle size of primary particles. In addition, this term "mean particle size $D_{50}$" refers to a mean particle size $D_{50}$ calculated from a volume cumulative distribution measured by the laser diffraction method.

Details of Embodiments of the Present Invention

<Coating Liquid for Forming Conductive Layer>

The coating liquid for forming a conductive layer is used for forming a printed circuit board base material. Specifically, the coating liquid for forming a conductive layer is applied to one of surfaces of a base film that forms a printed circuit board, and subsequently heat-treated to thereby form a conductive layer (fine metal particle-sintered layer) which is disposed on the base film and formed of sintered fine metal particles.

The coating liquid for forming a conductive layer contains fine metal particles, a dispersant, and a dispersion medium. Copper or a copper alloy is used as a main component of the fine metal particles. Since the coating liquid for forming a conductive layer contains the fine metal particles that contain copper or a copper alloy as the main component, migration of the resulting conductive layer can be suppressed compared with the case where fine metal particles contain a noble metal such as silver, platinum, or palladium as a main component. Furthermore, since the coating liquid for forming a conductive layer contains the fine metal particles that contain copper or a copper alloy as the main component, electrical conductivity of the resulting conductive layer and adhesive strength to the base film can be enhanced. The fine metal particles may contain other metals as long as the fine metal particles contain copper or a copper alloy as the main component. However, in order to appropriately achieve the advantages described above, preferably, the fine metal particles do not contain other metals except for the case where other metals are inevitably contained.

The dispersant in the coating liquid for forming a conductive layer is a PEI-PEO graft copolymer. A PEI moiety in the PEI-PEO graft copolymer has a weight-average molecular weight of 300 or more and 1,000 or less, a molar ratio of PEO chains to nitrogen atoms in the PEI moiety is 10 or more and 50 or less, and the PEI-PEO graft copolymer has a weight-average molecular weight of 3,000 or more and 54,000 or less.

The coating liquid for forming a conductive layer contains, as the dispersant, a PEI-PEO graft copolymer, and the weight-average molecular weight of a PEI moiety in the PEI-PEO graft copolymer, the molar ratio of PEO chains to nitrogen atoms in the PEI moiety, and the weight-average molecular weight of the PEI-PEO graft copolymer are within the above ranges. Thus, uniform dispersibility of the PEI-PEO graft copolymer in the dispersion medium can be enhanced. According to this configuration, nitrogen atoms in the PEI moiety of the PEI-PEO graft copolymer are coordinated on the fine metal particle side, and thus the fine metal particles can be easily uniformly dispersed in the dispersion medium. Therefore, the coating liquid for forming a conductive layer has good dispersibility of the fine metal particles and good storage stability. Accordingly, when the coating liquid for forming a conductive layer is applied to one of surfaces of a base film that forms a printed circuit board base material and subsequently heated, a conductive layer (fine metal particle-sintered layer) having good denseness and smoothness can be formed on the one surface of the base film.

(Fine Metal Particle)

As described above, the fine metal particles contain copper or a copper alloy as the main component. The lower limit of a mean particle size $D_{50}$ of the fine metal particles is preferably 1 nm, more preferably 5 nm, and still more preferably 10 nm. The upper limit of the mean particle size $D_{50}$ is preferably 200 nm and more preferably 100 nm. When the mean particle size $D_{50}$ is less than the lower limit, dispersibility and stability of the fine metal particles in the dispersion medium may decrease. In contrast, when the mean particle size $D_{50}$ exceeds the upper limit, the density of the fine metal particles tends to be non-uniform in applying the coating liquid for forming a conductive layer. As a result, it may become difficult to form a sufficiently dense conductive layer.

The lower limit of a mean particle size $D_{50SEM}$ of the fine metal particles calculated on the basis of a measurement with a scanning electron microscope (SEM) is preferably 1 nm, more preferably 5 nm, and still more preferably 10 nm. The upper limit of the mean particle size $D_{50SEM}$ is preferably 250 nm and more preferably 150 nm. When the mean particle size $D_{50SEM}$ is less than the lower limit, dispersibility and stability of the fine metal particles in the dispersion medium may decrease. In contrast, when the mean particle size $D_{50SEM}$ exceeds the upper limit, the density of the fine metal particles tends to be non-uniform in applying the coating liquid for forming a conductive layer. As a result, it may become difficult to form a sufficiently dense conductive layer. The term "mean particle size $D_{50SEM}$" refers to a particle size at which a cumulative volume is 50% when surfaces of fine metal particles are observed with a scanning electron microscope (SEM) to measure the sizes of 100 fine metal particles that are arbitrarily selected, and the volume is accumulated in the ascending order of the particle size.

The upper limit of a ratio ($D_{50SEM}/D_{50}$) of the mean particle size $D_{50SEM}$ of the fine metal particles calculated on the basis of the measurement with a scanning electron microscope to the mean particle size $D_{50}$ of the fine metal particles is preferably 2.0, more preferably 1.5, and still more preferably 1.3. When the ratio ($D_{50SEM}/D_{50}$) exceeds the upper limit, the shapes of the fine metal particles tend to be non-uniform. As a result, the surface of a conductive layer formed by applying the coating liquid for forming a conductive layer may have insufficient smoothness. The lower limit of the ratio ($D_{50SEM}/D_{50}$) is not particularly limited and may be, for example, 1.

The lower limit of a content of the fine metal particles in the coating liquid for forming a conductive layer is preferably 20% by mass and more preferably 25% by mass. The upper limit of the content of the fine metal particles is preferably 80% by mass, more preferably 50% by mass, and still more preferably 35% by mass. When the content of the fine metal particles is less than the lower limit, it may become difficult to form a conductive layer having a sufficient thickness and a sufficient density. In contrast, when the content of the fine metal particles exceeds the upper limit, it may become difficult to uniformly disperse the fine metal particles in the dispersion medium.

(Dispersant)

As described above, a PEI-PEO graft copolymer is used as the dispersant. This PEI-PEO graft copolymer preferably has a dendrimer structure in which a PEI moiety functions as a core. The PEI-PEO graft copolymer is present in the dispersion medium in a state in which nitrogen atoms in the PEI moiety are coordinated on the fine metal particle side. The presence of the PEI-PEO graft copolymer in the state in which nitrogen atoms in the PEI moiety are coordinated on the fine metal particle side suppresses aggregation of the fine metal particles and allows the fine metal particles to be uniformly dispersed in the dispersion medium. The coating liquid for forming a conductive layer may contain, as the dispersant, another dispersant in addition to the PEI-PEO graft copolymer. However, preferably, the coating liquid does not contain another dispersant in order to effectively improve uniform dispersibility of fine metal particles.

The lower limit of a weight-average molecular weight of the PEI moiety of the PEI-PEO graft copolymer is 300 and more preferably 400. The upper limit of the weight-average molecular weight is 1,000 and more preferably 850. When the weight-average molecular weight is less than the lower limit, the effect of preventing aggregation of the fine metal particles to maintain dispersion of the fine metal particles may be insufficiently provided. As a result, it may become difficult to form a sufficiently dense conductive layer. In contrast, when the weight-average molecular weight exceeds the upper limit, the dispersant is excessively bulky and may inhibit sintering of the fine metal particles, resulting in formation of voids, in heat treatment performed after application of the coating liquid for forming a conductive layer. As a result, it may become difficult to form a dense conductive layer having a low resistance. Furthermore, such an excessively bulky dispersant may decrease electrical conductivity of the conductive layer due to decomposition residues of the dispersant.

The lower limit of a molar ratio of PEO chains to nitrogen atoms in the PEI moiety of the PEI-PEO graft copolymer is 10, more preferably 15, and still more preferably 20. The upper limit of the molar ratio is 50, more preferably 40, and still more preferably 35. When the molar ratio is less than the lower limit, dispersibility of the PEI-PEO graft copolymer in the dispersion medium may decrease. In contrast, when the molar ratio exceeds the upper limit, it may become difficult to produce the PEI-PEO graft copolymer.

The lower limit of a weight-average molecular weight of the PEI-PEO graft copolymer is 3,000, more preferably 4,000, and sill more preferably 6,000. The upper limit of the weight-average molecular weight is 54,000, more preferably 45,000, and still more preferably 35,000. When the weight-average molecular weight is less than the lower limit, the effect of preventing aggregation of the fine metal particles to maintain dispersion of the fine metal particles may be insufficiently provided. As a result, it may become difficult to form a sufficiently dense conductive layer. In contrast, when the weight-average molecular weight exceeds the upper limit, the dispersant is excessively bulky and may inhibit sintering of the fine metal particles, resulting in formation of voids, in heat treatment performed after application of the coating liquid for forming a conductive layer. As a result, it may become difficult to form a dense conductive layer having a low resistance. Furthermore, such an excessively bulky dispersant may decrease electrical conductivity of the conductive layer due to decomposition residues of the dispersant.

The lower limit of a content ratio of nitrogen atoms derived from the dispersant (PEI-PEO graft copolymer) to the fine metal particles is preferably 0.01% by mass and more preferably 0.05% by mass. The upper limit of the content ratio is preferably 10% by mass, more preferably 1% by mass, and still more preferably 0.5% by mass. When the content ratio is less than the lower limit, the fine metal particles cannot be sufficiently surrounded by the dispersant, and aggregation of the fine metal particles in the dispersion medium may not be prevented sufficiently. In contrast, when the content ratio exceeds the upper limit, sintering of the fine metal particles is inhibited, resulting in formation of voids, in heat treatment performed after application of the coating liquid for forming a conductive layer. As a result, it may become difficult to form a dense conductive layer having a low resistance.

(Dispersion Medium)

The dispersion medium contained in the coating liquid for forming a conductive layer is not particularly limited, but water is typically used.

The dispersion medium may optionally contain an organic solvent. Various water-soluble organic solvents can be used as the organic solvent. Examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of a polyhydric alcohol such as ethylene glycol or glycerin or another compound; and glycol ethers such as ethylene glycol monoethyl ether and diethylene glycol monobutyl ether.

When the dispersion medium contains an organic solvent, the lower limit of a content of the organic solvent in the coating liquid for forming a conductive layer is preferably 25% by mass and more preferably 30% by mass. The upper limit of the content of the organic solvent is preferably 75% by mass and more preferably 70% by mass. When the content of the organic solvent is less than the lower limit, the effect of, for example, adjusting the viscosity and adjusting the vapor pressure, the effect being exerted by the organic solvent, may be insufficiently provided. In contrast, when the content of the organic solvent exceeds the upper limit, the effect of swelling the dispersant exerted by water may be insufficiently provided, which may result in aggregation of the fine metal particles in the coating liquid for forming a conductive layer.

(Other Components)

The coating liquid for forming a conductive layer preferably further contains chloride ions. Chloride ions further contained in the coating liquid for forming a conductive layer make OH groups at the ends of polyethylene oxide chains of the PEI-PEO graft copolymer difficult to ionize. Therefore, chloride ions further contained in the coating liquid for forming a conductive layer enable an improvement in dispersibility of the PEI-PEO graft copolymer in the dispersion medium to further enhance dispersibility of the fine metal particles.

When the coating liquid for forming a conductive layer contains chloride ions, the lower limit of a content of the chloride ions in the coating liquid for forming a conductive layer is preferably 0.2 g/L and more preferably 0.5 g/L. The upper limit of the content of the chloride ions is preferably 10.0 g/L, more preferably 7.0 g/L, and still more preferably 5.0 g/L. When the content of the chloride ions is less than the lower limit, dispersibility of the PEI-PEO graft copolymer in the dispersion medium may not be sufficiently improved. In contrast, when the content of the chloride ions exceeds the upper limit, sintering of the fine metal particles may be inhibited.

The coating liquid for forming a conductive layer may contain other components such as sodium ions in addition to the chloride ions.

The lower limit of a pH of the coating liquid for forming a conductive layer is preferably 4, more preferably 4.3, and still ore preferably 4.5. The upper limit of the pH is preferably 8, more preferably 7, and still more preferably 6.5. When the pH is less than the lower limit, the absolute value of the zeta potential of the fine metal particles may not be sufficiently high, and dispersibility of the fine metal particles may decrease. In contrast, when the pH exceeds the upper limit, dispersibility of the PEI-PEO graft copolymer in the dispersion medium may become insufficient, and dispersibility of the fine metal particles may thereby decrease.

The lower limit of an electrical conductivity of the coating liquid for forming a conductive layer is preferably 100

μS/cm, more preferably 150 μS/cm, and sill more preferably 200 μS/cm. The upper limit of the electrical conductivity is preferably 800 μS/cm, more preferably 700 μS/cm, and still more preferably 600 μS/cm. When the electrical conductivity is less than the lower limit, the fine metal particles may easily aggregate. In contrast, when the electrical conductivity exceeds the upper limit, an excessive amount of decomposition residues of the dispersant etc. may remain as impurities in a conductive layer formed from the coating liquid for forming a conductive layer. As a result, the electrical conductivity of the conductive layer may decrease. The term "electrical conductivity" refers to a value measured in accordance with JIS-K0130:2008.

The upper limit of a viscosity at 25° C. of the coating liquid for forming a conductive layer is preferably 100 mPa·s, more preferably 30 mPa·s, and still more preferably 15 mPa·s. The lower limit of the viscosity is preferably 1 mPa·s. When the viscosity exceeds the upper limit, coating properties may decrease. In contrast, when the viscosity is less than the lower limit, formability of a coating film may decrease. The term "viscosity" refers to a value measured in accordance with JIS-Z8803:2011.

<Method for Producing Coating Liquid for Forming Conductive Layer>

The coating liquid for forming a conductive layer can be produced by, for example, producing fine metal particles by a high-temperature treatment method, a liquid-phase reduction method, a gas-phase method, or the like, washing the fine metal particles with water, and dispersing the fine metal particles in a solution in which the dispersant (PEI-PEO graft copolymer) is contained in a dispersion medium in a predetermined concentration.

<Method for Producing Conductive Layer>

Next, a method for producing a conductive layer using the coating liquid for forming a conductive layer, the coating liquid containing the fine metal particles, the dispersant, and the dispersion medium, will be described with reference to FIGS. 1 to 4. Hereinafter, a description will be given of a case where a conductive layer of a printed circuit board base material is produced by using the coating liquid for forming a conductive layer.

The method for producing a conductive layer includes an application step of applying the coating liquid for forming a conductive layer and a heating step of heating the coating liquid for forming a conductive layer after the application. The method for producing a conductive layer may further include a metal plating layer formation step of forming a metal plating layer on an outer surface of a fine metal particle-sintered layer that is formed by sintering of fine metal particles due to the heating. In the method for producing a conductive layer, the fine metal particles contain copper or a copper alloy as a main component, the dispersant is a PEI-PEO graft copolymer, a PEI moiety in the PEI-PEO graft copolymer has a weight-average molecular weight of 300 or more and 1,000 or less, a molar ratio of PEO chains to nitrogen atoms in the PEI moiety is 10 or more and 50 or less, and the PEI-PEO graft copolymer has a weight-average molecular weight of 3,000 or more and 54,000 or less. In the method for producing a conductive layer according to this embodiment, a laminated body including the fine metal particle-sintered layer and the metal plating layer is formed as a conductive layer.

In the method for producing a conductive layer, a conductive layer is produced by using the coating liquid for forming a conductive layer, the coating liquid having good dispersibility of the fine metal particles in the dispersion medium and good storage stability due to the presence of the predetermined PEI-PEO graft copolymer contained as the dispersant. Therefore, the method for producing a conductive layer enables formation of a conductive layer (fine metal particle-sintered layer) having good denseness and smoothness. Furthermore, in the method for producing a conductive layer, since the fine metal particles contain copper or a copper alloy as the main component, migration of the resulting conductive layer can be suppressed compared with the case where fine metal particles contain a noble metal such as silver, platinum, or palladium as a main component.

(Application Step)

In the application step, the coating liquid for forming a conductive layer is applied to one of surfaces of a base film 1, as illustrated in FIG. 1.

The base film 1 has an insulating property. Examples of a main component of the base film 1 include flexible synthetic resins such as polyimides, liquid-crystal polymers, fluororesins, polyethylene terephthalate, and polyethylene naphthalate; rigid materials such as paper impregnated with a phenolic resin, paper impregnated with an epoxy resin, glass composites, fiberglass cloths impregnated with an epoxy resin, Teflon (registered trademark), and glass base materials; and rigid-flexible materials which are composites of a hard material and a soft material. Of these, polyimides are preferred because they exhibit high bonding strength to, for example, a metal oxide.

Examples of the method for applying the coating liquid for forming a conductive layer to one of surfaces of the base film 1 include conventionally known coating methods such as spin coating, spray coating, bar coating, die coating, slit coating, roll coating, and dip coating. Alternatively, the coating liquid for forming a conductive layer may be applied to only a portion of one of surfaces of the base film 1 by, for example, a screen-printing method or using a dispenser. After the application of the coating liquid for forming a conductive layer, the coating liquid is dried at a temperature of, for example, room temperature or higher to form a coating film 3 containing fine metal particles 2. The upper limit of the drying temperature is preferably 100° C. and more preferably 40° C. When the drying temperature exceeds the upper limit, cracks may be formed in the coating film 3 due to rapid drying of the coating film 3.

The lower limit of an average thickness of the coating film 3 (the average thickness when the coating liquid for forming a conductive layer is applied once) is preferably 0.1 μm and more preferably 0.2 μm. The upper limit of the average thickness of the coating film 3 is preferably 0.5 μm and more preferably 0.4 μm. When the average thickness of the coating film 3 is less than the lower limit, a fine metal particle-sintered layer 4 obtained in a heating step described below may not have a sufficiently large thickness. In contrast, when the average thickness of the coating film 3 exceeds the upper limit, the density of the fine metal particles in the coating film 3 tends to become non-uniform, and consequently, it may become difficult to form a sufficiently dense fine metal particle-sintered layer 4. The term "average thickness" refers to an average of a thickness of a coating film portion where fine metal particles are present, the thickness being measured by X-ray fluorescence spectroscopy. The average can be determined by, for example, measuring the thicknesses at 10 positions at a rate of one position per 10 cm$^2$, and averaging the thicknesses at the 10 positions.

The upper limit of a surface roughness Sa of the coating film 3 is preferably 0.12 μm and more preferably 0.08 μm. When the surface roughness Sa of the coating film 3 exceeds the upper limit, it may become difficult to form the sufficiently dense fine metal particle-sintered layer 4. The lower limit of the surface roughness Sa of the coating film 3 is not particularly limited and may be, for example, 0.01 μm. The term "surface roughness Sa" refers to a value determined in accordance with ISO25178.

(Heating Step)

Figure 2:
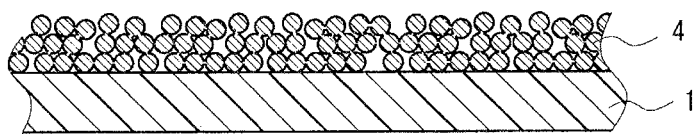
FIG. 2 is a schematic sectional view illustrating a heating step of a method for producing a conductive layer according to an embodiment of the present invention.

In the heating step, the coating film 3 is fired to form a fine metal particle-sintered layer 4, as illustrated in FIG. 2. In the heating step, by firing the coating film 3, the fine metal particles 2 are sintered together, and the resulting sintered body of the fine metal particles 2 is fixed to the one surface of the base film 1. Substantially all of the dispersant etc. and other organic substances contained in the coating film 3 are volatilized or decomposed by this firing.

Near the interface of the fine metal particle-sintered layer 4 with the base film 1, the fine metal particles are oxidized by heating to generate a metal oxide based on the metal of the fine metal particles or a group derived from the metal oxide while suppressing the generation of a metal hydroxide based on the metal or a group derived from the metal hydroxide. Specifically, when copper is used as the fine metal particles, copper oxide and copper hydroxide are generated near the interface of the fine metal particle-sintered layer 4 with the base film 1, but copper oxide is generated in a larger amount than copper hydroxide. The copper oxide generated near the interface of the fine metal particle-sintered layer 4 is strongly bonded to, for example, a polyimide contained in the base film 1 as a main component, and thus the adhesive strength between the fine metal particle-sintered layer 4 and the base film 1 increases.

The heating step is performed in an atmosphere in which a certain amount of oxygen is contained. The lower limit of the oxygen concentration of the atmosphere during the heat treatment is preferably 1 ppm and more preferably 10 ppm. The upper limit of the oxygen concentration is preferably 10,000 ppm and more preferably 1,000 ppm. When the oxygen concentration is less than the lower limit, the amount of copper oxide generated near the interface of the fine metal particle-sintered layer 4 decreases, and sufficient adhesive strength between the fine metal particle-sintered layer 4 and the base film 1 may not be obtained. In contrast, when the oxygen concentration exceeds the upper limit, the fine metal particles are excessively oxidized, which may result in a decrease in the electrical conductivity of the fine metal particle-sintered layer 4.

The lower limit of the heating temperature is preferably 150° C. and more preferably 200° C. The upper limit of the heating temperature is preferably 500° C. and more preferably 400° C. When the heating temperature is lower than the lower limit, the amount of copper oxide generated near the interface of the fine metal particle-sintered layer 4 decreases, and sufficient adhesive strength between the fine metal particle-sintered layer 4 and the base film 1 may not be obtained. In contrast, when the heating temperature exceeds the upper limit, the base film 1 may be deformed in the case where the base film 1 is formed of an organic resin such as a polyimide.

(Metal Plating Layer Formation Step)

The metal plating layer formation step includes a first-metal plating layer formation step and a second-metal plating layer formation step.

(First-Metal Plating Layer Formation Step)

Figure 3:
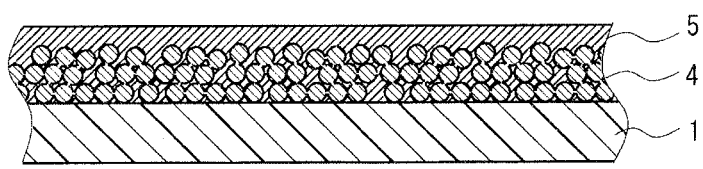
FIG. 3 is a schematic sectional view illustrating a first-metal plating layer formation step of a method for producing a conductive layer according to an embodiment of the present invention.

In the first-metal plating layer formation step, a first metal plating layer 5 is formed on an outer surface (one surface) of the fine metal particle-sintered layer 4, as illustrated in FIG. 3. Specifically, in the first-metal plating layer formation step, gaps in the fine metal particle-sintered layer 4 are filled with a plated metal, and this plated metal is stacked on the one surface of the fine metal particle-sintered layer 4. Since the method for producing a conductive layer includes the first-metal plating layer formation step, the adhesive strength between the conductive layer and the base film 1 can be enhanced.

The plating method for forming the first metal plating layer 5 is not particularly limited and may be electroless plating or electroplating. However, the plating method is preferably electroless plating, with which peel strength between the fine metal particle-sintered layer 4 and the base film 1 can be easily and reliably improved by more appropriately filling the gaps between the fine metal particles that form the fine metal particle-sintered layer 4.

The procedure when the electroless plating is employed is not particularly limited. The electroless plating can be performed by known means together with processes such as a cleaner step, a water-washing step, an acid treatment step, a water-washing step, a pre-dip step, an activator step, a water-washing step, a reduction step, and a water-washing step.

Also in the case where the electroplating is employed, the procedure is not particularly limited. For example, the procedure can be appropriately selected from known electrolytic plating baths and plating conditions.

After the gaps in the fine metal particle-sintered layer 4 are filled with the plated metal, heat treatment is preferably further performed. This heat treatment further increases the amount of copper oxide near the interface between the fine metal particle-sintered layer 4 and the base film 1. Thus, the adhesive strength between the fine metal particle-sintered layer 4 and the base film 1 can be further improved.

(Second-Metal Plating Layer Formation Step)

Figure 4:
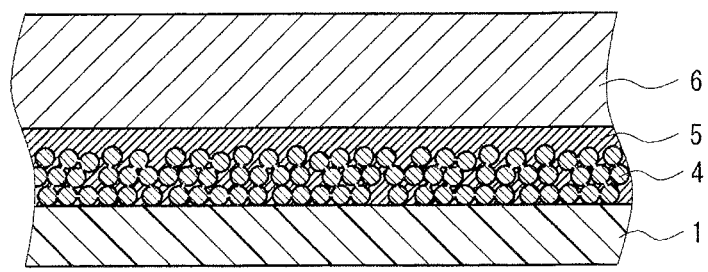
FIG. 4 is a schematic sectional view illustrating a second-metal plating layer formation step of a method for producing a conductive layer according to an embodiment of the present invention.

In the second-metal plating layer formation step, a second metal plating layer 6 is formed on an outer surface (one surface) of the first metal plating layer 5, as illustrated in FIG. 4. Since the method for producing a conductive layer includes the second-metal plating layer formation step, the thickness of the conductive layer can be easily and reliably adjusted.

The plating method for forming the second metal plating layer 6 is not particularly limited and may be electroless plating or electroplating. However, the plating method is preferably electroplating, with which the thickness can be easily and accurately adjusted and the second metal plating layer 6 can be formed within a relatively short time.

The procedure when the electroless plating is employed is not particularly limited. The electroless plating can be performed by the same procedure as in the case of the formation of the first metal plating layer 5. Also in the case where the electroplating is employed, the procedure is not particularly limited. The electroplating can be performed by the same procedure as in the case of the formation of the first metal plating layer 5.

The conductive layer produced by the method for producing a conductive layer is formed, by patterning, as a conductive pattern disposed on the one surface of the base film 1. As a result, a printed circuit board that includes the base film 1 and the conductive pattern disposed on the one surface of the base film 1 is produced.

<Conductive Layer>

The conductive layer is obtained by the above-described method for producing a conductive layer. The conductive layer includes a sintered body of fine metal particles (fine metal particle-sintered layer 4). The fine metal particles contain copper or a copper alloy as a main component. The fine metal particle-sintered layer 4 includes a residue derived from a PEI-PEO graft copolymer in which a PEI moiety in the PEI-PEO graft copolymer has a weight-average molecular weight of 300 or more and 1,000 or less, a molar ratio of PEO chains to nitrogen atoms in the PEI moiety is 10 or more and 50 or less, and the PEI-PEO graft copolymer has a weight-average molecular weight of 3,000 or more and 54,000 or less.

In the conductive layer, the sintered body of fine metal particles contains a predetermined PEI-PEO graft copolymer. That is, the conductive layer is formed by sintering fine metal particles that are uniformly dispersed in a coating liquid due to the presence of the PEI-PEO graft copolymer. Therefore, the conductive layer has good denseness and smoothness.

OTHER EMBODIMENTS

It is to be understood that the embodiments disclosed herein are only illustrative and are not restrictive in all respects. The scope of the present invention is not limited to the configurations of the embodiments and is defined by the claims described below. The scope of the present invention is intended to cover all the modifications within the meaning and scope of the claims and their equivalents.

For example, the coating liquid for forming a conductive layer is not necessarily used for forming a printed circuit board base material. The method for producing a conductive layer is not necessarily carried out as a method for producing a conductive layer of a printed circuit board base material.

Even in the case where the method for producing a conductive layer is carried out as a method for producing a conductive layer of a printed circuit board base material, the method does not necessarily include the metal plating layer formation step. In the method for producing a conductive layer, a conductive layer may be produced by, for example, performing the application step and the heating step a plurality of times. Furthermore, even in the case where the method for producing a conductive layer includes the metal plating layer formation step, the method does not necessarily include both the first-metal plating layer formation step and the second-metal plating layer formation step but may include only the first-metal plating layer formation step. In addition, in the method for producing a conductive layer, a conductive layer need not be formed only on one of surfaces of a base film. Alternatively, a conductive layer may be formed on each of the two surfaces of a base film.

The conductive layer does not necessarily include a metal plating layer, but may be constituted by only a sintered body of fine metal particles (fine metal particle-sintered layer). Even in the case where the conductive layer includes a metal plating layer, the conductive layer does not necessarily include both a first metal plating layer and a second metal plating layer but may include only a first metal plating layer.

EXAMPLES

The present invention will now be described in more detail by way of Examples. However, the present invention is not limited to the Examples.

Examples

[No. 1]

In a beaker, 80 g (0.1 M) of a titanium trichloride solution serving as a reducing agent, 50 g of sodium carbonate serving as a pH adjuster, 90 g of sodium citrate serving as a complexing agent, and 1 g of a PEI-PEO graft copolymer serving as a dispersant were dissolved in 1 L of pure water, and the temperature of the resulting aqueous solution was maintained at 35° C. An aqueous solution of 10 g (0.04 M) of copper nitrate trihydrate, the temperature of which was maintained at the same temperature (35° C.), was added to the aqueous solution, and the aqueous solution was stirred to precipitate fine copper particles. Furthermore, the fine copper particles separated by centrifugation were repeatedly subjected to a washing step with 200 mL of pure water twice, and the fine copper particles were dried to prepare powdery fine copper particles. The fine copper particles had a mean particle size $D_{50}$ of 30 nm. Subsequently, pure water was added to the powdery fine copper particles to adjust the concentration. Thus, a coating liquid for forming a conductive layer, the coating liquid having a content ratio of fine copper particles of 30% by mass, was produced. Table 1 shows the weight-average molecular weight (Mw) of the PEI moiety in the PEI-PEO graft copolymer contained in the coating liquid for forming a conductive layer, the molar ratio of PEO chains to nitrogen atoms in the PEI moiety, and the weight-average molecular weight (Mw) of the PEI-PEO graft copolymer. Table 1 also shows the pH of the coating liquid for forming a conductive layer, the content ratio of nitrogen atoms derived from the dispersant (PEI-PEO graft copolymer) to fine metal particles, and the content of chloride ions. Furthermore, 300 μL of the coating liquid for forming a conductive layer was applied by bar coating onto a polyimide film (10 cm square) which had been subjected to a hydrophilic treatment to form a coating film. The coating film was fired at 250° C. to form a conductive layer formed of a sintered body of fine metal particles.

The "mean particle size $D_{50}$" was measured by using a particle size distribution analyzer "Nanotrac Wave-EX150" available from MicrotracBEL Corp. on the basis of a mean particle size $D_{50}$ calculated from a volume cumulative distribution.

The "weight-average molecular weight (Mw)" was measured under the measurement conditions described below.
Measuring apparatus: "HLC-8220GPC" available from Tosoh Corporation
Column: GMH-HR-H
Mobile phase: N-methyl-2-pyrrolidone
Column temperature: 40° C.
Flow rate: 0.5 mL/min
Sample concentration: 1.0% by mass
Amount of sample injected: 10 μL
Detector: Differential refractometer
Standard material: monodisperse polystyrene The "content ratio of nitrogen atoms derived from the dispersant to fine metal particles" was measured by total nitrogen analysis using an oxygen circulating method.

[No. 2 to No. 11]

Coating liquids for forming conductive layers were produced in which the mean particle size $D_{50}$ of fine copper particles, the weight-average molecular weight (Mw) of the PEI moiety in the PEI-PEO graft copolymer contained in the coating liquid for forming a conductive layer, the molar ratio of PEO chains to nitrogen atoms in the PEI moiety, the weight-average molecular weight (Mw) of the PEI-PEO graft copolymer, the content ratio of fine copper particles, the pH of the coating liquid for forming a conductive layer, the content ratio of nitrogen atoms derived from the dispersant to fine metal particles, and the content of chloride ions were as shown in Table 1. In No. 2 to No. 11, the coating liquids for forming conductive layers were each produced by the same method as that used in No. 1 except that the PEI-PEO graft copolymer was added to pure water (dispersion medium) as required in order to adjust the concentration of the dispersant in the coating liquid for a forming conductive layer. Subsequently, 300 μL of each of the coating liquids for forming conductive layers was applied by bar coating onto a polyimide film (10 cm square) which had been subjected to a hydrophilic treatment to form coating films. Furthermore, the coating films were fired at 250° C. to form conductive layers each formed of a sintered body of fine metal particles.

Comparative Examples

[No. 12 to No. 15]

Coating liquids for forming conductive layers were produced in which the mean particle size $D_{50}$ of fine copper particles, the weight-average molecular weight (Mw) of the PEI moiety in the PEI-PEO graft copolymer contained in the coating liquid for forming a conductive layer, the molar ratio of PEO chains to nitrogen atoms in the PEI moiety, the weight-average molecular weight (Mw) of the PEI-PEO graft copolymer, the content ratio of fine copper particles, the pH of the coating liquid for forming a conductive layer, the content ratio of nitrogen atoms derived from the dispersant to fine metal particles, and the content of chloride ions were as shown in Table 1. In No. 12 to No. 15, the coating liquids for forming conductive layers were each produced by the same method as that used in No. 1 except that the PEI-PEO graft copolymer was added to pure water (dispersion medium) as required in order to adjust the concentration of the dispersant in the coating liquid for forming a conductive layer. Subsequently, 300 μL of each of the coating liquids for forming conductive layers was applied by bar coating onto a polyimide film (10 cm square) which had been subjected to a hydrophilic treatment to form coating films. Furthermore, the coating films were fired at 250° C. to form conductive layers each formed of a sintered body of fine metal particles.

<Mean Particle Size $D_{50SEM}$>

The mean particle size $D_{50SEM}$ was determined by measuring a particle size [nm] at which a cumulative volume was 50% when surfaces of fine metal particles were observed with a scanning electron microscope (SEM) at a magnification of 100 k to 300 k to measure the sizes of 100 fine metal particles that were arbitrarily selected, and the volume was accumulated in the ascending order of the particle size. The results of this measurement are shown in Table 2.

<Surface Roughness>

The surface of a coating film was observed with a laser microscope "VK-X150" available from KEYENCE Corporation at an objective lens magnification of 100 and at a digital zoom of 1 time. An area in the range of 30 μm×30 μm was analyzed at a height cut level of 90 to measure a surface roughness Sa [μm] in accordance with ISO25178. The results of this measurement are shown in Table 2.

<Resistivity>

A resistivity [μΩ·cm] of a conductive layer was measured by using a "Loresta GP MCP-T610 model" available from Mitsubishi Chemical Analytech Co., Ltd. in accordance with JIS-K7194:1994. The results of this measurement are shown in Table 2. Note that the upper limit of this resistivity is 10,000 [μΩ·cm].

TABLE 2

| | Coating liquid for forming conductive layer | | | |
|---|---|---|---|---|
| | Fine metal particles | | Coating | |
| | Mean particle size $D_{50SEM}$ of fine copper particles [nm] | Mean particle size $D_{50SEM}$/Mean particle size $D_{50}$ | film Surface roughness [nm] | Conductive layer Resistivity [μ Ω · cm] |
| No. 1 | 33 | 1.1 | 45 | 35 |
| No. 2 | 54 | 1.8 | 61 | 910 |

TABLE 1

| | Coating liquid for forming conductive layer | | | | | | | |
|---|---|---|---|---|---|---|---|---|
| | Dispersant | | | Fine metal particles | | | | |
| | Weight-average molecular weight (Mw) of PEI moiety | Molar ratio of PEO chains to nitrogen atoms in PEI moiety | Weight-average molecular weight (Mw) of PEI-PEO graft copolymer | Mean particle size $D_{50}$ of fine copper particles [nm] | Content ratio [mass %] | pH | Content ratio of nitrogen atoms derived from dispersant to fine metal particles [wt %] | Content of chloride ions [g/L] |
| No. 1 | 800 | 20 | 17,600 | 30 | 30 | 5.2 | 0.20 | 3.62 |
| No. 2 | 800 | 10 | 9,200 | 34 | 30 | 6.2 | 0.20 | 1.13 |
| No. 3 | 800 | 35 | 30,100 | 28 | 30 | 4.6 | 0.28 | 4.56 |
| No. 4 | 300 | 10 | 3,400 | 48 | 20 | 6.2 | 0.16 | 1.52 |
| No. 5 | 300 | 20 | 6,500 | 38 | 20 | 5.8 | 0.28 | 2.63 |
| No. 6 | 300 | 35 | 11,300 | 34 | 20 | 4.8 | 0.20 | 3.78 |
| No. 7 | 800 | 20 | 17,600 | 30 | 30 | 8.2 | 0.80 | 9.86 |
| No. 8 | 800 | 20 | 17,600 | 30 | 30 | 3.8 | 0.008 | 0.53 |
| No. 9 | 800 | 10 | 9,200 | 180 | 30 | 6.2 | 0.04 | 1.02 |
| No. 10 | 800 | 10 | 9,200 | 34 | 30 | 6.5 | 0.95 | 1.45 |
| No. 11 | 800 | 30 | 25,900 | 17 | 30 | 5.2 | 0.24 | 3.65 |
| No. 12 | 200 | 35 | 7,500 | 82 | 30 | 4.4 | 0.16 | 2.13 |
| No. 13 | 300 | 7 | 2,500 | 60 | 30 | 7.1 | 0.02 | 0.76 |
| No. 14 | 800 | 7 | 6,700 | 54 | 30 | 6.4 | 0.16 | 0.82 |
| No. 15 | 1200 | 35 | 45,200 | 50 | 30 | 5.3 | 0.20 | 2.65 |

TABLE 2-continued

| | Coating liquid for forming conductive layer Fine metal particles | | Coating | |
|---|---|---|---|---|
| | Mean particle size $D_{50SEM}$ of fine copper particles [nm] | Mean particle size $D_{50SEM}$/Mean particle size $D_{50}$ | film Surface roughness [nm] | Conductive layer Resistivity [μΩ·cm] |
| No. 3 | 31 | 1.1 | 30 | 4 |
| No. 4 | 86 | 1.8 | 65 | 1,200 |
| No. 5 | 57 | 1.5 | 57 | 210 |
| No. 6 | 44 | 1.3 | 47 | 6 |
| No. 7 | 51 | 1.7 | 89 | 7,600 |
| No. 8 | 54 | 1.8 | 82 | 5,200 |
| No. 9 | 198 | 1.1 | 110 | 7,200 |
| No. 10 | 46 | 1.4 | 53 | 9,700 |
| No. 11 | 19 | 1.1 | 27 | 6 |
| No. 12 | 197 | 2.4 | 122 | >10,000 |
| No. 13 | 156 | 2.6 | 141 | >10,000 |
| No. 14 | 167 | 3.1 | 136 | >10,000 |
| No. 15 | 60 | 1.2 | 61 | >10,000 |

[Evaluation Results]

As shown in Tables 1 and 2, in No. 1 to No. 11, since the weight-average molecular weight (Mw) of the PEI moiety in the PEI-PEO graft copolymer, the molar ratio of PEO chains to nitrogen atoms in the PEI moiety, and the weight-average molecular weight (Mw) of the PEI-PEO graft copolymer are appropriately adjusted, aggregation of the fine metal particles is suppressed in the coating liquid for forming a conductive layer, and as a result, the ratio of the mean particle size $D_{50SEM}$ to the mean particle size $D_{50}$ of the fine metal particles is suppressed to be low. Furthermore, in No. 1 to No. 11, since the mean particle size $D_{50SEM}$ of the fine metal particles is suppressed to be small and the fine metal particles have good uniform dispersibility in the coating liquid for forming a conductive layer, a dense coating film having a sufficiently small surface roughness is obtained, and a dense conductive layer is thereby obtained. In particular, in No. 1, No. 3, No. 5, No. 6, and No. 11, in which the weight-average molecular weight (Mw) of the PEI moiety in the PEI-PEO graft copolymer, the molar ratio of PEO chains to nitrogen atoms in the PEI moiety, and the weight-average molecular weight (Mw) of the PEI-PEO graft copolymer are sufficiently adjusted, the mean particle size $D_{50}$ of the fine metal particles is sufficiently small, and the ratio of the mean particle size $D_{50SEM}$ to the mean particle size $D_{50}$ is sufficiently low, since the fine metal particles that have uniform and very small particle size are uniformly dispersed in the coating liquid for forming a conductive layer, the surface roughness of the resulting coating film is suppressed to be particularly small, and the conductive layer also has a low resistivity.

In contrast, in No. 12, since the PEI moiety in the PEI-PEO graft copolymer has a low weight-average molecular weight (Mw), aggregation of the fine metal particles is accelerated in the coating liquid for forming a conductive layer, and the fine metal particles have a high ratio of the mean particle size $D_{50SEM}$ to the mean particle size $D_{50}$. Therefore, in No. 12, the coating film has insufficient denseness and a large surface roughness, and consequently, the conductive layer has insufficient denseness and a high resistivity. In No. 13, since the molar ratio of PEO chains to nitrogen atoms in the PEI moiety is low, and the PEI-PEO graft copolymer has a low weight-average molecular weight (Mw), aggregation of the fine metal particles is accelerated in the coating liquid for forming a conductive layer, and the fine metal particles have a high ratio of the mean particle size $D_{50SEM}$ to the mean particle size $D_{50}$. Therefore, in No. 13, the coating film has insufficient denseness and a large surface roughness, and consequently, the conductive layer has insufficient denseness and a high resistivity.

In No. 14, since the molar ratio of PEO chains to nitrogen atoms in the PEI moiety is low, dispersibility of the PEI-PEO graft copolymer in the coating liquid for forming a conductive layer decreases. As a result, aggregation of the fine metal particles cannot be sufficiently suppressed in the coating liquid for forming a conductive layer, and the fine metal particles have a high ratio of the mean particle size $D_{50SEM}$ to the mean particle size $D_{50}$. Therefore, in No. 14, the coating film has insufficient denseness and a large surface roughness, and consequently, the conductive layer has insufficient denseness and a high resistivity. Furthermore, in No. 15, since the PEI moiety in the PEI-PEO graft copolymer has a high weight-average molecular weight (Mw), the dispersant is excessively bulky and sintering of the fine metal particles is inhibited during the formation of the conductive layer. Therefore, in No. 15, the conductive layer has insufficient denseness and a high resistivity.

The invention claimed is:

1. A coating liquid for forming a conductive layer, the coating liquid comprising fine metal particles, a dispersant, chloride ions, and a dispersion medium,
   wherein the fine metal particles contain copper or a copper alloy as a main component,
   the dispersant is a polyethyleneimine-polyethylene oxide graft copolymer,
   a polyethyleneimine moiety in the graft copolymer has a weight-average molecular weight of 300 or more and 1,000 or less,
   a molar ratio of polyethylene oxide chains to nitrogen atoms in the polyethyleneimine moiety is 10 or more and 50 or less,
   the graft copolymer has a weight-average molecular weight of 3,000 or more and 54,000 or less, and
   a content of chloride ions is 0.2 g/L or more and 10.0 g/L or less,
   wherein an electrical conductivity of the coating liquid for forming the conductive layer is 100 μS/cm or more and 800 μS/cm or less.

2. The coating liquid for forming a conductive layer according to claim 1, wherein the fine metal particles have a mean particle size D50 of 1 nm or more and 200 nm or less.

3. The coating liquid for forming a conductive layer according to claim 1, wherein the coating liquid has a pH of 4 or more and 8 or less.

4. The coating liquid for forming a conductive layer according to claim 1, wherein a content ratio of nitrogen atoms derived from the dispersant to the fine metal particles is 0.01% by mass or more and 10% by mass or less.

5. The coating liquid for forming a conductive layer according to claim 1, wherein the polyethyleneimine-polyethylene oxide graft copolymer has a dendrimer structure in which the polyethyleneimine moiety functions as a core of the polyethyleneimine-polyethylene oxide graft copolymer.

6. A method for producing a conductive layer using a coating liquid for forming a conductive layer, the coating liquid containing fine metal particles, a dispersant, chloride ions, and a dispersion medium, the method comprising:
   an application step of applying the coating liquid for forming a conductive layer; and
   a heating step of, after the application, heating the coating liquid for forming a conductive layer,
   wherein the fine metal particles contain copper or a copper alloy as a main component, the dispersant is a polyethyleneimine-polyethylene oxide graft copolymer, a polyethyleneimine moiety in the graft copolymer has a weight-average molecular weight of 300 or more and 1,000 or less, a molar ratio of polyethylene oxide chains to nitrogen atoms in the polyethyleneimine moiety is 10 or more and 50 or less, the graft copolymer has a weight-average molecular weight of 3,000 or more and 54,000 or less, and a content of chloride ions is 0.2 g/L or more and 10.0 g/L or less, wherein an electrical conductivity of the coating liquid for forming the conductive layer is 100 µS/cm or more and 800 µS/cm or less.

7. The method for producing a conductive layer using a coating liquid for forming a conductive layer according to claim 6, wherein the polyethyleneimine-polyethylene oxide graft copolymer has a dendrimer structure in which the polyethyleneimine moiety functions as a core of the polyethyleneimine-polyethylene oxide graft copolymer.

\* \* \* \* \*